US006835656B1

(12) United States Patent
Besser et al.

(10) Patent No.: US 6,835,656 B1
(45) Date of Patent: Dec. 28, 2004

(54) METHOD OF FORMING ULTRA-SHALLOW JUNCTIONS IN A SEMICONDUCTOR WAFER WITH A DEPOSITED SILICON LAYER AND IN-SITU ANNEAL TO REDUCE SILICON CONSUMPTION DURING SALICIDATION

(75) Inventors: Paul R. Besser, Sunnyvale, CA (US); Minh Van Ngo, Fremont, CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 10/163,459

(22) Filed: Jun. 7, 2002

(51) Int. Cl.[7] .............................................. H01L 21/44
(52) U.S. Cl. ....................... 438/655; 438/663; 438/664; 438/682
(58) Field of Search ................................ 438/655, 682, 438/300, 301

(56) References Cited

U.S. PATENT DOCUMENTS

| | | | | |
|---|---|---|---|---|
| 5,994,191 A | * | 11/1999 | Xiang et al. | 438/300 |
| 6,165,903 A | * | 12/2000 | Besser et al. | 438/682 |
| 6,380,040 B1 | * | 4/2002 | Kepler et al. | 438/301 |
| 6,534,402 B1 | * | 3/2003 | Liao | 438/659 |
| 6,660,621 B1 | * | 12/2003 | Besser et al. | 438/592 |

OTHER PUBLICATIONS

*A self-aligned silicide process for thin silicon–on–insulator MOSFETs and MOSFETs with shallow junctions*, IBM T. J. Watson Research Center, Yorktown Heights, NY 10598. (a manuscript submitted for publication to Materials Research Society 2001).

* cited by examiner

*Primary Examiner*—David Nelms
*Assistant Examiner*—Thao P. Le

(57) ABSTRACT

A method for forming ultra-shallow junctions in a semiconductor wafer with reduced silicon consumption during salicidation supplies additional silicon during the salicidation process. After the gate and source/drain junctions are formed in a semiconductor device, high-resistivity metal silicide regions are formed on the gate and source/drain junctions. Amorphous silicon is then deposited in a layer on the high resistivity metal silicide regions by high density plasma chemical vapor deposition. The deposition of the amorphous-silicon is at an elevated temperature which causes transforming of the high resistivity metal silicide regions to low resistivity metal silicide regions on the gate and source/drain junctions. The deposited amorphous-silicon acts as a source of silicon that is employed as a diffusion species during the transformation of the high resistivity metal silicide to the low resistivity metal silicide.

13 Claims, 2 Drawing Sheets

METHOD OF FORMING ULTRA-SHALLOW JUNCTIONS IN A SEMICONDUCTOR WAFER WITH A DEPOSITED SILICON LAYER AND IN-SITU ANNEAL TO REDUCE SILICON CONSUMPTION DURING SALICIDATION

FIELD OF THE INVENTION

The present invention relates to the field of semiconductor device manufacturing, and more particularly, to the formation of low resistivity self-aligned silicide regions on the gate and source/drain junctions.

BACKGROUND OF THE INVENTION

There is currently a desire to evaluate the use of selective epitaxial silicon in the manufacturing of semiconductor devices. The need for this technology is the "roadmap" for silicon thickness on silicon-on-insulator (SOI) and the desire for faster parts on bulk silicon. The SOI roadmap suggests that the silicon thickness may be reduced to less than 500 Å in the near future. Assuming that each Angstrom of deposited cobalt (Co) in a conventional salicide process consumes approximately 3.5 Å of silicon from the substrate, a silicon thickness of 500 Å will be mostly consumed by the deposition and reaction of 100–130 Å of Co. Hence, the entirety and even the majority consumption of the silicon will deteriorate the transistor performance significantly. In addition, it is widely accepted that the elevation of the source and drain (or the reduction of silicon consumption) during silicidation is desirable for improving transistor performance, of either bulk or SOI devices.

A major difficulty with elevated source/drain technology is the actual elevating of the source/drains. The process must be selective and uniform, both of which pose difficult challenges. Selectivity means that the silicon must be grown epitaxially upon exposed silicon areas (source and drain), while not depositing on the exposed oxide or nitride regions. In addition, the silicon must be of uniform thickness across the wafer and across areas of differing patterning density. These constraints make the implementation of selective epitaxial silicon difficult. There are additional challenges as well. The process for selective epitaxial silicon involves the in-situ cleaning at elevated temperatures and deposition of silicon from a very reactive precursor. The deposition is sensitive to the condition of the silicon onto which the epitaxial silicon is grown. Thus, any surface damage from reactive chemical etching and/or ion implantation could be catastrophic and a difficult variable to control in the manufacturing of thousands of wafers per week. This makes the implantation of such a technology in actual production very challenging.

There are alternatives to selective epitaxial silicon that are being investigated. Once such technique is described in "A Self-Aligned Silicide Process to Thin Silicon-On-Insulator MOSFETs and bulk MOSFETs with Shallow Junctions", a manuscript submitted for publication to Materials Research Society (2001), from the IBM T. J. Watson Research Center, Cohen et al. In this alternative technique, Cohen et al. describes the modification of the salicide process to include co-sputtering of silicon with cobalt. After the reaction of this cobalt with the exposed silicon substrate in a conventional salicide process, a layer of amorphous silicon (a-Si) is deposited onto the exposed salicide and reacted with the $Co_2Si$ during formation of $CoSi_2$. The source of silicon above the $Co_2Si$ helps reduce the silicon consumption from the substrate.

In U.S. Pat. No. 6,165,903, a method is described for forming ultra shallow junctions in a semiconductor wafer with reduced silicon consumption during salicidation by supplying additional silicon during a salicidation process. After the gate and source/drain junctions are formed in a semiconductor device, high resistivity metal silicide regions are formed on the gate and source/drain junctions. Silicon is then deposited in a layer on the high resistivity metal silicide regions. An annealing step is then performed to form low resistivity metal silicide regions on the gate and source/drain junctions. The deposited silicon is a source of silicon that is employed as a diffusion species during the transformation of the high resistivity metal silicide to a low resistivity metal silicide. Since the additional silicon provided in the deposited layer is consumed, there is reduced consumption of the silicon from the ultra-shallow junctions, thereby preventing the bottom of the silicide regions from reaching the bottom of the source/drain junctions.

Although the technique described in U.S. Pat. No. 6,165,903 may be considered a viable alternative to the process of selective epitaxial silicon on production wafers, improvements to the process are desirable in order to produce higher quality devices with reduced expenditures and with higher throughput. This would make the process even more commercially viable.

SUMMARY OF THE INVENTION

These and other needs are met by embodiments of the present invention which provide a method of forming ultra-shallow junctions in a semiconductor wafer, and comprises the steps of forming a gate and source/drain junctions having upper surfaces. First metal silicide regions are formed on the gate and source/drain junctions. These first metal silicide regions have a first resistivity. Amorphous silicon is deposited on the first metal silicide regions. Annealing is performed to form second metal silicide regions with a second resistivity that is lower than the first resistivity. The annealing causes a diffusion reaction of the first metal silicide regions and the amorphous silicon. The depositing of the amorphous silicon and the annealing to form the second metal silicide regions are performed in-situ in a single tool. In certain embodiments of the invention, the single tool is a high density plasma chemical vapor deposition (HDP CVD) tool.

With the present invention, the number of process steps and the number of required tools to produce the structure are reduced. In particular, separate processing tools for deposition of the amorphous silicon and the rapid thermal annealing are not needed. The present invention carries out both functions in a single tool, such as a high density plasma chemical vapor deposition tool, for example. In addition to reducing the number of tools that are used, throughput is increased due to the carrying out of both process steps in a single tool. Also, significant cost savings are also provided, since the high density plasma chemical vapor deposition tool is a relatively inexpensive tool, rather than the relatively expensive processing tools typically employed for depositing amorphous silicon and for performing rapid thermal anneals.

In addition to the cost savings and the higher throughput provided by the present invention, the invention also provides for a uniform deposition of the silicon since it is deposited from a silane precursor and the temperature is well controlled.

In other embodiments of the invention, the earlier stated needs are also met by providing a method of forming silicide, including the steps of forming first metal silicide regions on a substrate, the first metal silicide regions having a first resistivity. Amorphous silicon is then deposited by high density plasma chemical vapor deposition on the first metal silicide regions at a temperature that causes the first metal silicide regions to transform to second metal silicide regions having a second resistivity lower than the first resistivity. At least some of the amorphous silicon is consumed to form the second metal silicide regions.

The foregoing and other features, aspects and advantages of the present invention will become more apparent from the following detailed description of the present invention when taken in conjunction with the accompanying drawings.

DETAILED DESCRIPTION OF THE INVENTION

The present invention addresses and solves problems related to the deposition of an amorphous silicon layer, and the high costs associated with the formation of this layer and subsequent anneal. The invention achieves this, in part, through certain embodiments of the invention which provide for the depositing of amorphous silicon on the high resistivity metal silicide regions and the annealing to form metal silicide regions with a lower resistivity, where the deposition and the annealing are performed in a single tool. In certain embodiments of the invention, this tool is a high density plasma chemical vapor deposition (HDP CDV) tool. The silicon in the deposited layer acts as a source of silicon for diffusion during the reaction and the transformation of the high resistivity metal regions to lower resistivity silicide regions. The reduction in silicon consumption in the source/drain junctions allows these junctions to be made shallower and avoid junction leakage concerns.

Figure 1:
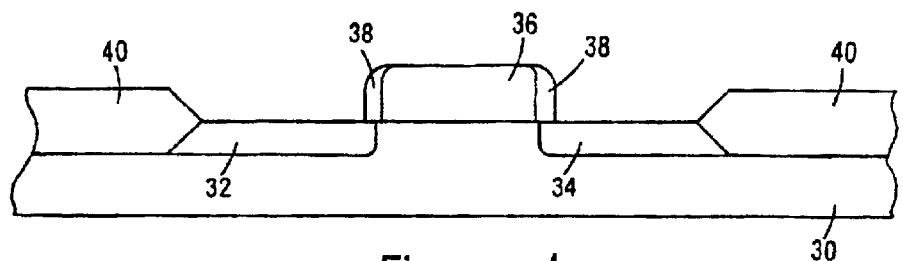
FIG. 1 is a cross-section of a portion of a semiconductor wafer prior to a salicidation process in accordance with certain embodiments of the present invention.

FIG. 1 is a cross-section of a semiconductor device on a semiconductor wafer on which low resistivity metal silicide regions will be formed in accordance with embodiments of the present invention. As with conventional semiconductor devices, a source junction 32 and a drain junction 34 are formed within a silicon substrate 30. A gate etch has produced a gate 36. Oxide (or nitride) spacers 38 are provided on the sides of the polysilicon gate electrode 36. Oxide isolation (such as LOCOS) regions 40 isolate individual semiconductor devices from each other.

Figure 2:
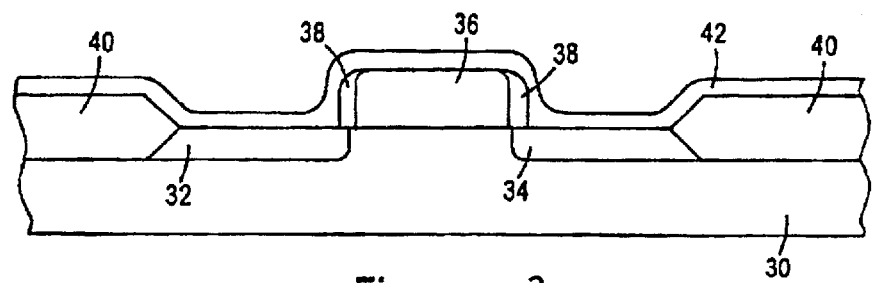
FIG. 2 is a depiction of the semiconductor device of FIG. 1, following the application of a metal layer, such as cobalt, in accordance with certain embodiments of the present invention.

As shown in FIG. 2, a layer of refractory metal 42 is then deposited uniformly across the entire wafer, preferably using physical vapor deposition from an ultra-pure sputtering target and a commercially available ultra-high-vacuum, multi-chamber, DC magnetron sputtering system. In certain preferred embodiments, the metal is cobalt (Co). Cobalt has a number of advantages over other types of metals. For example, in comparison to silicon, titanium silicide sheet resistance rises dramatically due to narrow-line effects. Since the low resistivity phase of cobalt silicide forms by a diffusion reaction rather than nucleation-and-growth as in the low resistivity phase of titanium silicide, cobalt silicide has been introduced by several integrated circuit manufacturers as the replacement for titanium. However, the use of cobalt in layer 42 as a refractory metal is exemplary only, as other metals, such as nickel, may be employed.

Figure 3:
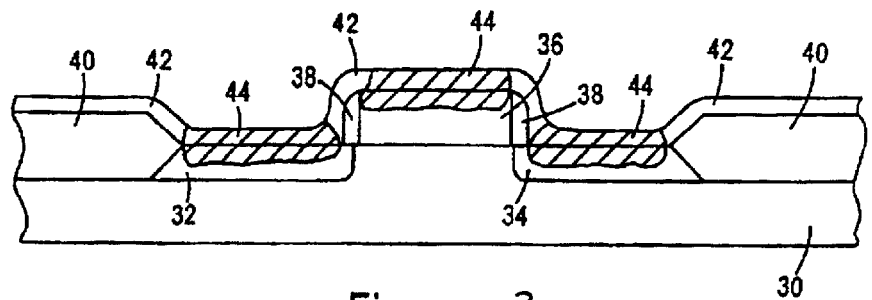
FIG. 3 depicts the semiconductor device of FIG. 2 following a first rapid thermal anneal step to form high resistivity metal silicide regions in accordance with embodiments of the present invention.

FIG. 3 depicts the semiconductor device of FIG. 2 after the formation of high resistivity metal silicide regions 44. In certain preferred embodiments, the high resistivity metal silicide regions 44 are created by a rapid thermal anneal step. The high resistivity metal silicide regions 44 may be made of cobalt silicide (CoSi), for example. The first rapid thermal annealing step may be performed by exposing the semiconductor wafer to a temperature between about 450° C. and about 600° C., and most preferably 500° C. The semiconductor wafer will be exposed for a relatively short time, for example, between about 5 and 90 seconds. As is apparent from FIG. 3, some of the silicon in the source and drain junctions 32, 34 is consumed during the first rapid thermal annealing step to become part of the high resistivity metal silicide regions 44. This is true also for the silicon in the polysilicon gate 36. At this point, a second thermal annealing step performed immediately in accordance with the prior art could cause excessive silicon consumption and the silicide to reach the bottom of the source or drain junctions 32, 34, leading to junction leakage. As will be further described, the present invention avoids this concern by supplying silicon for consumption during the annealing process.

Figure 4:
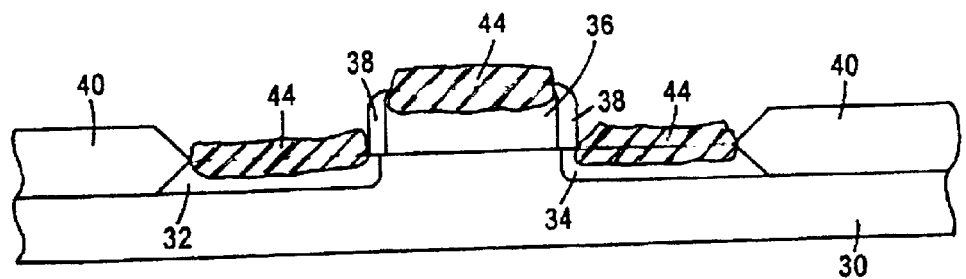
FIG. 4 depicts the semiconductor device of FIG. 3 following a selective etch that removes unreacted metal in accordance with embodiments of the present invention.

Prior to the supplying of additional silicon, a selective etch is performed to remove any unreacted refractory metal, such as cobalt A typical etchant employed to remove unreacted cobalt is 3HCl:$H_2O_2$. Removal of the unreacted metal by the peroxide solution leaves the silicide regions 44 intact. The resultant structure is depicted in FIG. 4.

Figure 5:
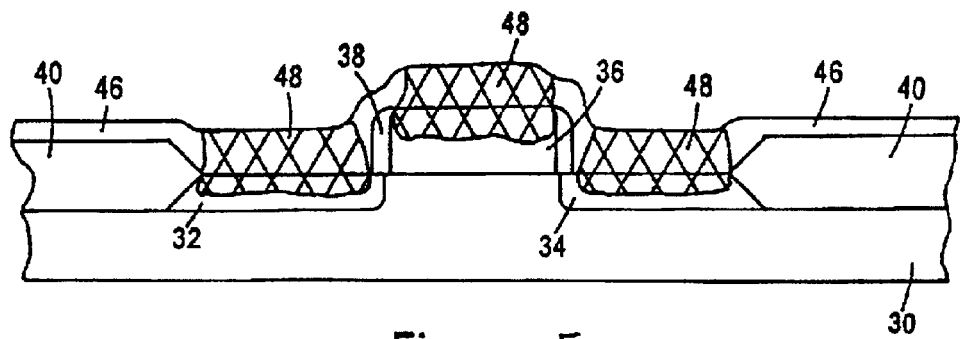
FIG. 5 is a depiction of the semiconductor device of FIG. 4 after blanket deposition of a silicon layer and annealing to form low resistivity metal silicide regions, in accordance with embodiments of the present invention.

Following the removal of any unreacted metal, the additional silicon is then provided by a blanket deposition of silicon over the areas of the semiconductor device as shown in FIG. 5. The silicon layer 46 that has been deposited therefore covers the oxide isolation 40, the spacers 38, and the high resistivity metal silicide (e.g. CoSi) regions 44. The silicon layer may be deposited to a thickness between about 50 Å and 1000 Å, and preferably to a thickness of about 300 Å. Stated alternatively, although it can vary greatly, an exemplary ratio of thickness of the deposited silicon to the thickness of the high resistivity metal silicide regions 44 is about 1.5:1.

The silicon provided in the deposited silicon layer 46 supplies silicon for the transformation of the high resistivity metal silicide regions to low resistivity metal silicide regions. This transformation is a diffusion process, and silicon is the diffusing species during the reaction. By depositing silicon on the surface, less silicon will be consumed from the junction areas 32, 34 as the low resistivity metal silicide regions are formed.

In the present invention, the silicon layer 46 is an amorphous silicon layer that is deposited by high density plasma chemical vapor deposition (HDP CVD). The silicon is deposited from a silane (SiH$_4$) gas at elevated temperatures. The silicon deposition is uniform since it is deposited from a silane precursor and the temperature is closely controlled. The deposition of the amorphous silicon in an HDP CVD tool reduces the number of process steps and the number of required tools. In particular, the use of a physical vapor deposition tool and a separate rapid thermal anneal tool are not needed. Both of these tools are relatively expensive, in comparison to the single HDP CVD tool that is employed in their place in accordance with embodiments of the present invention.

Hence, the deposition of the amorphous silicon is performed at the same time that the low resistivity silicide regions 48 are produced. The amorphous silicon that is being deposited is consumed by the transformation process. The result is the production of lower resistivity metal silicide regions 48, as depicted in FIG. 5.

In certain embodiments of the invention, the deposition of the amorphous silicon by high density plasma chemical vapor deposition is performed at between approximately 600 to 650° C. un-clamped, un-biased with silane flow between about 25 to 250 sccm, helium being supplied at between 50 to about 1000 sccm, and source RF power being controlled to between about 2000 and about 4000 w. With these parameters, a suitable HDP amorphous-silicon layer 46 is provided. The deposition of the amorphous silicon at high temperatures causes the first metal silicide regions 44 to transform into the low resistivity metal regions, consuming at least some of the amorphous-silicon layer 46 that has been deposited.

As silicon is the diffusing species in the reaction during the transformation of the high resistivity phase of cobalt silicide (CoSi) to the low resistivity phase (CoSi$_2$), silicon from the silicon layer 46 is consumed. However, the silicon in the source/drain junctions 32, 34 will not be excessively consumed since the silicon layer 46 supplies additional silicon for the monosilicide to disilicide transformation. The low resistivity metal silicide regions 48, as depicted in FIG. 5, do not reach the bottom of the source/drain junctions 32, 34. Hence, a junction leakage problem is avoided with the embodiments of the present invention.

Instead of cobalt, another metal such as nickel may be used. In such embodiments, the high resistivity metal silicide regions 44 are Ni$_2$Si, and the low resistivity metal silicide regions 48 are NiSi.

Figure 6:
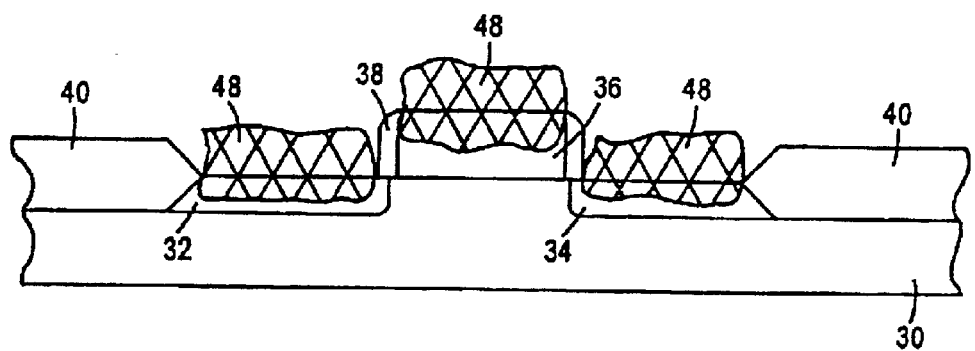
FIG. 6 depicts the semiconductor device of FIG. 5, following removal of unreacted silicon, in accordance with certain embodiments of the present invention.

In certain instances, the unreacted silicon in silicon layer 46 may be left in place. However, in certain cases, the unreacted silicon and silicon layer 46 will produce bridging across the spacer 40. In such cases, the unreacted silicon 46 needs to be stripped from the wafer surface to prevent the bridging across spacer 40. FIG. 6 depicts the semiconductor device of FIG. 5 after the unreacted silicon 46 has been stripped. The unreacted silicon is stripped by a selective etching process.

The embodiments of the present invention allow ultra-shallow junctions to be formed and employed in a semiconductor device with a low resistivity metal silicide, such as cobalt silicide (CoSi$_2$) or nickel silicide (NiSi), while avoiding junction leakage due to excessive silicon consumption during the salicidation process. This permits faster devices and better performance of the semiconductor device. An exemplary embodiment has been described in which cobalt is employed as the refractory metal in forming the silicide. However, the present invention finds utility in other applications employing other materials in which a monosilicide is transferred to a disilicide, where silicon is the diffusing species. The depositing of amorphous silicon and annealing in a single tool by employing HDP CVD, for example, reduces costs, increases throughput, and provides a uniform amorphous silicon deposition.

Only certain preferred embodiments of the present invention and but a few examples of its versatility are shown and described in the present disclosure. It is to be understood that the present invention is capable of using various other combinations and environments is capable of changes and modifications within the scope of the invention concept has expressed herein.

What is claimed is:

1. A method of forming ultra-shallow junctions in a semiconductor wafer, comprising the steps of:

forming a gate and source/drain junctions having upper surfaces;

forming first metal silicide regions on the gate and source/drain junctions, the first metal silicide regions having a first resistivity;

depositing amorphous silicon (a-Si) on the first metal silicide regions; and annealing to form second metal silicide regions with a second resistivity, lower than the first resistivity, by diffusion reaction of the first metal silicide regions and the a-Si;

wherein the depositing of the a-Si and the annealing to form the second metal silicide regions are performed in-situ in a single tool.

2. A method of forming ultra-shallow junctions in a semiconductor wafer, comprising the steps of:

forming a gate and source/drain junctions having upper surfaces;

forming first metal silicide regions on the gate and source/drain junctions, the first metal silicide regions having a first resistivity;

depositing amorphous silicon (a-Si) on the first metal silicide regions; and annealing to form second metal silicide regions with a second resistivity, lower than the first resistivity, by diffusion reaction of the first metal silicide regions and the a-Si;

wherein the depositing of the a-Si and the annealing to form the second metal silicide regions are performed in-situ in a single tool;

wherein the single tool is a high density plasma chemical vapor deposition (HDP CVD) tool.

3. The method of claim 2, wherein the step of depositing a-Si includes controlling the temperature within a processing chamber of the HDP CVD tool to between about 600 to about 650° C.

4. The method of claim 2, wherein the step of depositing a-Si includes supplying silane (SiH4) to a processing chamber of the HDP CVD tool with a flow of between about 25 to about 250 sccm.

5. The method of claim 2, wherein the step of depositing a-Si includes supplying He to a processing chamber of the HDP CVD tool with a few of between about 50 to about 1000 sccm.

6. The method of claim 2, wherein the step of depositing a-Si includes controlling source RF power of the HDP CVD tool to between about 2000 to about 4000 w.

7. The method of claim 2, wherein the step of depositing a-Si includes controlling the temperature within a processing chamber of the HDP CVD tool to between about 600 to about 650° C., supplying silane (SiH4) to the processing chamber with a flow of between about 25 to about 250 sccm, supplying He to the processing chamber with a flow of between about 50 to about 1000 sccm, and with a source RF power between about 200 to about 4000 w.

8. A method of forming ultra-shallow junctions in a semiconductor wafer, comprising the steps of:

forming a gate and source/drain functions having upper surfaces;

forming first metal silicide regions on the gate and source/drain junctions, the first metal silicide regions having a first resistivity;

depositing amorphous silicon (a-Si) on the first metal silicide regions; and annealing to form second metal silicide regions with a second resistivity, lower than the first resistivity, by diffusion reaction of the first metal silicide regions and the a-Si;

wherein the depositing of the a-Si and the annealing to form the second metal silicide regions are performed in-situ in a single tool;

wherein the second metal silicide regions comprise $CoSi_2$.

9. A method of forming silicide, comprising the steps of:

forming first metal silicide regions on a substrate, the first metal silicide regions having a first resistivity; and depositing amorphous silicon (a-Si) by high density plasma chemical vapor deposition (HDP CVD) on the first metal silicide regions at a temperature that causes the first metal silicide regions to transform to second metal silicide regions having a second resistivity lower than the first resistivity, with at least some of the a-Si being consumed to form the second metal silicide regions.

10. The method of claim 9, wherein the step of depositing a-Si by HDP CVD includes performing the HDP CVD in a single processing tool.

11. The method of claim 9, wherein the second metal silicide regions comprise CoSi2.

12. The method of claim 9, wherein the second metal silicide regions comprise NiSi.

13. The method of claim 9, wherein the step of depositing a-Si includes controlling the temperature of the HDP CVD process to between about 600 to about 650° C., supplying silane (SiH4) with a flow of between about 25 to about 250 sccm, supplying He with a flow of between about 50 to about 1000 sccm, and controlling RF power to between about 2000 to about 4000 w.

* * * * *